United States Patent [19]
Lowrey et al.

[11] Patent Number: 5,581,104
[45] Date of Patent: Dec. 3, 1996

[54] STATIC DISCHARGE CIRCUIT HAVING LOW BREAKDOWN VOLTAGE BIPOLAR CLAMP

[75] Inventors: Tyler A. Lowrey; Randal W. Chance, both of Boise, Id.

[73] Assignee: Micron Technology, Inc., Boise, Id.

[21] Appl. No.: 425,678

[22] Filed: Apr. 18, 1995

Related U.S. Application Data

[63] Continuation of Ser. No. 177,643, Jan. 4, 1994, abandoned, which is a continuation of Ser. No. 947,072, Sep. 17, 1992, abandoned, which is a continuation of Ser. No. 642,096, Jan. 16, 1991, abandoned.

[51] Int. Cl.$^6$ ................................................. H01L 23/62
[52] U.S. Cl. ........................ 257/355; 257/356; 257/362; 257/363
[58] Field of Search ........................ 357/13, 20, 23.13, 357/34, 35, 86, 88, 90; 257/355, 356, 362, 363

[56] References Cited

U.S. PATENT DOCUMENTS

| | | |
|---|---|---|
| 4,080,616 | 3/1978 | Horie . |
| 4,100,562 | 7/1978 | Ollendorf ............................ 357/86 |
| 4,514,747 | 7/1985 | Miyata et al. ....................... 357/90 |
| 4,734,752 | 3/1988 | Lin et al. . |
| 4,739,378 | 4/1988 | Ferrari et al. . |
| 4,763,184 | 8/1988 | Krieger et al. . |
| 4,803,541 | 2/1989 | Kouda . |
| 4,829,344 | 5/1989 | Bertotti et al. . |
| 4,855,257 | 8/1989 | Kouda . |
| 4,972,247 | 11/1990 | Patterson et al. ................... 357/15 |
| 5,010,380 | 4/1991 | Avery ................................ 257/363 |

FOREIGN PATENT DOCUMENTS

| | | |
|---|---|---|
| 51-8531 | 7/1976 | Japan . |
| 9024691 | 11/1990 | WIPO ............................ 357/23.13 |

OTHER PUBLICATIONS

D. C. Goldthorp et al., "An Integrated Circuit Composite PNPN Diode", *IEDM 79* (Dec. 1979) pp. 180–183.

*Primary Examiner*—J. Carroll
*Attorney, Agent, or Firm*—Schwegman, Lundberg, Woessner & Kluth, P.A.

[57] ABSTRACT

A bipolar transistor and a bipolar diode are provided at an input pad on an integrated circuit, in order to shunt potential surges caused by electrostatic discharge (ESD). The approach makes use of a bipolar and a diode clamp with an optimized reverse biased breakdown from collector to base to shunt excess current away from sensitive regions with even current distribution for minimal damage. In order to improve the ESD immunity of the positive going ESD with respect to $V_{SS}$, the reverse bias breakdowns of the diode and of the transistor's functioning as a collector/base diode are reduced. This circuit provides a simple low cost approach for improving ESD protection, in a process which fits into most standard Cmos process flows with few or no added process steps.

8 Claims, 4 Drawing Sheets

5,581,104

STATIC DISCHARGE CIRCUIT HAVING LOW BREAKDOWN VOLTAGE BIPOLAR CLAMP

This is a continuation to U.S. patent application Ser. No. 08/177,643, filed Jan. 4, 1994, now abandoned, which is a continuation of U.S. patent application Ser. No. 07/947,072, filed Sep. 17, 1992, now abandoned, which is a continuation of U.S. patent application Ser. No. 07/642,096, filed Jan. 16, 1991, now abandoned.

FIELD OF THE INVENTION

This invention relates to semiconductor integrated circuits (IC's), and to circuitry within the IC to protect the IC from damage from excessive potential spikes caused by electrostatic discharge (ESD). The inventive circuit is intended for connection at the input and output pads of the IC.

BACKGROUND OF THE INVENTION

Electrostatic discharge (ESD) can result in permanent damage to an integrated circuit (IC). Most ICs operate at potentials under 25 volts, whereas ESD can greatly exceed such potentials. Damage is believed to occur when the high potential breaks down insulating barriers within the integrated circuitry, and the resulting current results in the permanent break down of the insulation. Regardless of the dynamics, it is desireable that the high potentials associated with ESD be dissipated before such damage can occur.

Prior art conventional means of providing for protection against damage due to inadvertent electrostatic discharge make use of diode and transistor clamps to shunt current away from sensitive internal circuit nodes. These devices can clamp to $V_{SS}$, $V_{CC}$ or both. It is desirable in many applications to provide clamp devices to $V_{SS}$ only, to avoid excessive input current when inputs go more than a forward biased diode drop above $V_{CC}$. It also allows for reduced layout area to provide clamps to one supply only. It further eliminates any NPNP SCR structures that can result in destructive latch-up if accidentally triggered by any number of means. A concern in clamping to $V_{SS}$ only is maintaining sufficient ESD protection when undergoing positive input ESD with respect to $V_{SS}$. This condition results in reverse bias breakdown of the clamp devices which can be destructive.

In this disclosure, "n" denotes silicon that has been doped with atoms having more than four valence electrons (group V or higher), such as arsenic, which introduce negatively charged majority carriers into the silicon, and "p" denotes silicon doped with atoms having less than four valence electrons (group III or lower), such as boron or phosphorus, which introduce positively charged majority carriers. The majority charge carrier type is also referred to as conductivity type. A plus or minus superscript on an n or p indicates heavy or light doping, respectively.

While silicon is used in the preferred embodiment, as is known to those skilled in the art of semiconductor manufacture, the invention is applicable to other doped semiconductor material. "n" indicates an excess of "negative" carriers (electrons) floating around in the material, from high valence impurities. "p" indicates material with an excess of "positive" carriers, or "holes", caused by low valence dopant atoms.

One prior art technique uses a p channel device on circuit inputs. This has the disadvantage of permitting an externally induced latch-up caused by a phenomenon known as "voltage bumping". If the input potential increases, or "bumps up", the structure of the p channel device results in a latchup. If the latchup consumes sufficient current, the device can destructively degenerate.

In providing ESD protection, it is desireable that a protective circuit not occupy significant surface area of the semiconductor die. It is further important that the protective circuit not cause significant time delays in the operation of the IC, or otherwise degrade the performance of the IC.

SUMMARY OF THE INVENTION

According to the present invention, a technique for improving the tolerance of MOS and bipolar IC inputs to damage from electrostatic discharge (ESD) is provided. The approach makes use of a bipolar transistor and a diode clamp with an optimized reverse bias breakdown from collector to base of the transistor, and from the anode to the cathode of the diode, to shunt excess current away from sensitive regions with even current distribution for minimal damage.

The invention utilizes a transistor and diode clamping approach to provide the desired ESD protection. Since that portion of the discharge circuit is not utilized for normal power and signal transmission, the performance of the IC is not significantly degraded by the protective circuit.

In one version of the proposed approach, applicable to products using a p type substrate, a pair of low value resistors are used to isolate clamp devices from an input pad and the remainder of the IC. A lateral NPN transistor's emitter is connected to ground, and the NPN transistor's base and a vertical diode's anode are connected to substrate, where vertical indicates an orientation nearly perpendicular to the major substrate surface. In an approach applicable to n-type substrates, a lateral PNP transistor's emitter is connected to power supply potential, and the diode's cathode and the PNP transistor's base are connected to substrate potential.

In order to improve the ESD immunity of the positive going ESD with respect to $V_{SS}$, the reverse bias breakdowns of the diode and of the transistor functioning as a collector/base diode are reduced by means of implantation into the anode/cathode junction of the diode and/or the collector/base junction of the transistor. For the case of a p type substrate, a p type species implantation (for example boron) in the n+/p junction regions would be performed. Typically the p type implantation would be masked from all or most other devices on the IC to avoid unwanted parasitic capacitance on internal operating nodes. In the case of an n type substrate, a masked n type implant (typically P, As or Sb) would be utilized.

In many processes, including most advanced DRAM and SRAM process flows, this implant is already being used internally to provide for extra junction capacitance on selected nodes (such as storage bit nodes). The reduced reverse bias breakdown of the clamps provides for reduced voltage developed on internal nodes during an ESD event. It also reduces the heat generation by reducing the power generation during the ESD event by shunting the same amount of current through a smaller voltage drop. This approach may be used with both n type and p type substrates.

Advantages for this proposed input protection scheme include providing a simple low cost approach for improving ESD, the ability to provide the desired circuitry in a process which fits into most standard CMOS process flows with few or no added process steps. The circuit requires minimal layout area to achieve solid ESD immunity, and no p-channel devices are required on the inputs. The avoidance of p-channel devices minimizes the potential for externally induced latch-up. Clamps to $V_{SS}$ only avoids input leakage when inputs go above the supply potential, $V_{CC}$, by a diode potential drop or more.

The circuit has easily adjustable BVCEO and diode breakdown voltage for flexibility for various applications and supply voltages. The use of this circuit has no significant impact on device speed and minimal increase in input capacitance.

DETAILED DESCRIPTION OF THE PREFERRED EMBODIMENTS

In a packaged integrated circuit, a semiconductor die is attached to a leadframe or leads within a housing by means of lead wires. The lead wires are bonded to the leads and to bond pads on the die.

Figure 1:
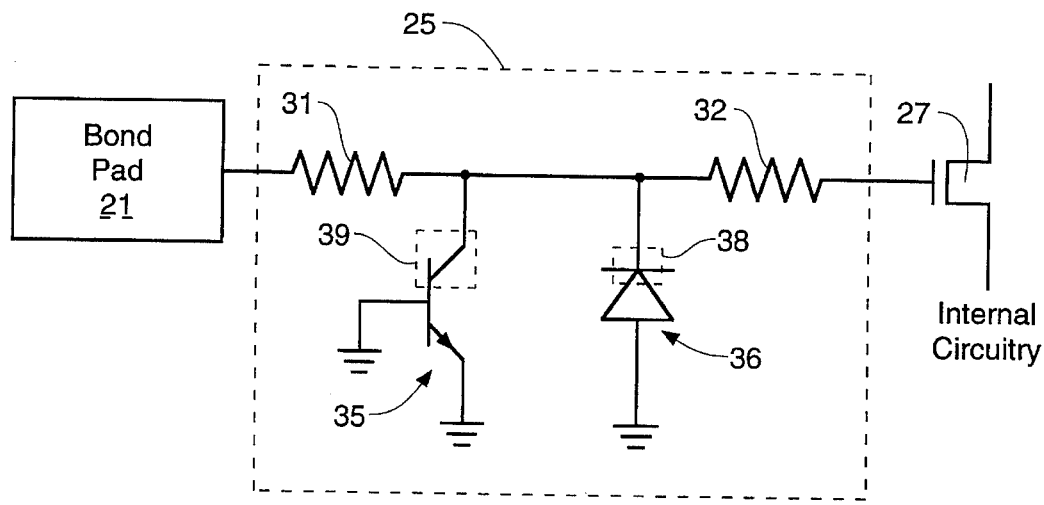
FIG. 1 shows a circuit configuration of a preferred embodiment of the invention, utilizing a p type substrate.
Figure 2:
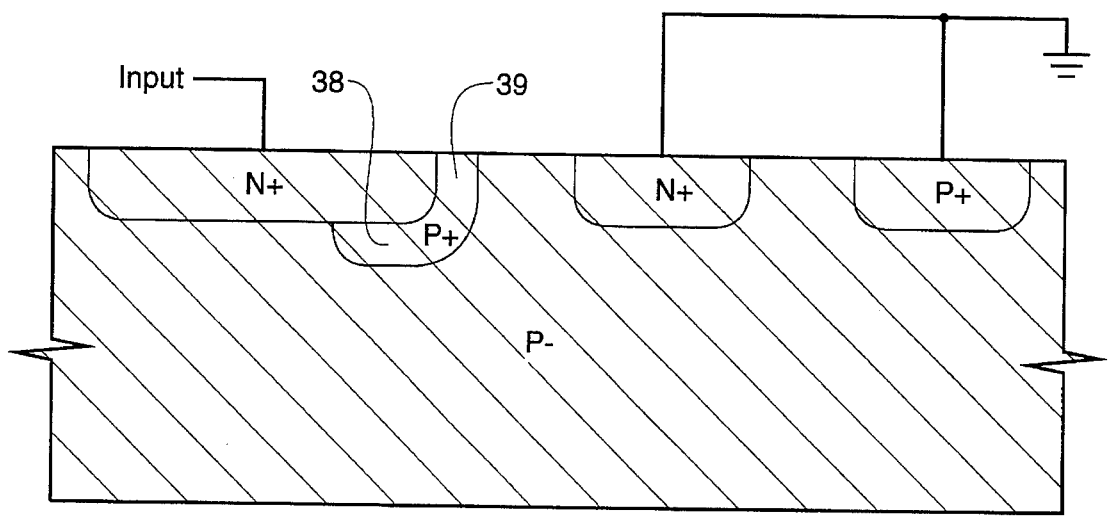
FIG. 2 shows a cross sectional view of a substrate, showing the structure of the circuit of FIG. 1.

FIGS. 1 and 2 are a representation of an input/output circuit on an integrated circuit chip. A bond pad 21 consists of metallic material and is used for attachment of the die 13 with a leadframe or external circuitry. Therefore the bond pad 21 may either be a wirebond pad, a bump or other means to connect circuitry on the die to external circuitry.

In order to achieve protection from electrostatic discharge (ESD), a discharge circuit 25 is provided between the bond pad 21 and internal circuitry 27, represented by a transistor. The discharge circuit 25 includes a pair of resistors 31, 32 and current discharge elements 35, 36 which discharge current either to ground as shown or to another supply node, when excess potential occurs at a node defined by the connection between the pair of resistors. The resistors 31, 32 are in series with the bond pad 21 and the internal circuitry 27, and the circuit elements 35, 36 discharge current from between the resistors 31, 32.

The discharge elements are a bipolar diode 36 and a bipolar transistor 35. Each of these has a locally reduced junction breakdown voltage, represented by dotted lines 38, 39. This establishes a breakdown voltage beyond the normal range of operation of the internal circuitry 27, but below potentials which would be damaging to the internal circuitry 27. The locally reduced breakdown voltage is a reduced reverse bias potential at which the impedance of a junction decreases. The decreased impedance effect is known as avalanching and is similar to the avalanche effect found in conventional zener diodes. It should be noted that the reverse bias across the junction does not necessarily coincide with reverse bias across the transistor, since typically, the two junctions in a bipolar transistor are oppositely biased. In the preferred embodiment, the locally reduced breakdown voltage is approximately 5 volts.

In order to improve the ESD immunity of the positive going ESD with respect to $V_{SS}$, the reverse bias breakdowns of the diode 36 and of the transistor 35 functioning as a collector/base diode are reduced by means of a p type species implantation (for example boron) into the n+/p junction regions. This results in the locally reduced breakdown voltage regions 38, 39. As shown in FIG. 2, the p type junction concentration is adjusted to provide for a doping level in the 1E16/cm$^3$ to 1E18/cm$^3$ range to result in reverse bias breakdown voltages in the 5–20 V range. Typically the p type implantation would be masked to avoid unwanted parasitic diode capacitance on internal operating nodes. In many processes, including most advanced DRAM and SRAM process flows, this implant is already being used internally to provide for extra junction capacitance on selected nodes (such as storage bit nodes). The reduced reverse bias breakdown of the clamps (devices 35 and 36) provides for reduced voltage developed on internal nodes during an ESD event. It also reduces the heat generation by reducing the power generation during the ESD event by shunting the same amount of current through a smaller voltage drop.

Figure 3:
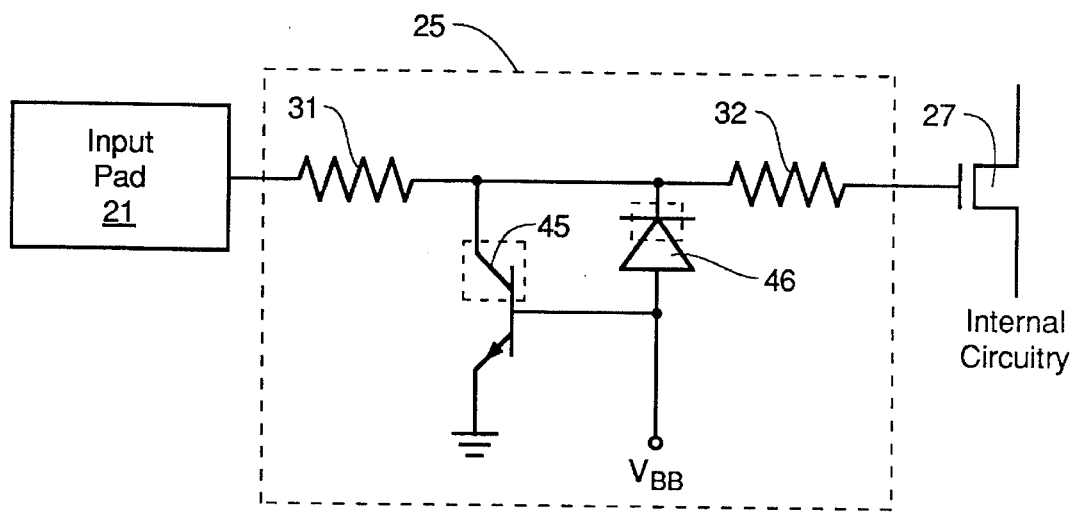
FIG. 3 shows a circuit modification of the circuit of FIG. 1, in which a non-grounded substrate is used.
Figure 4:
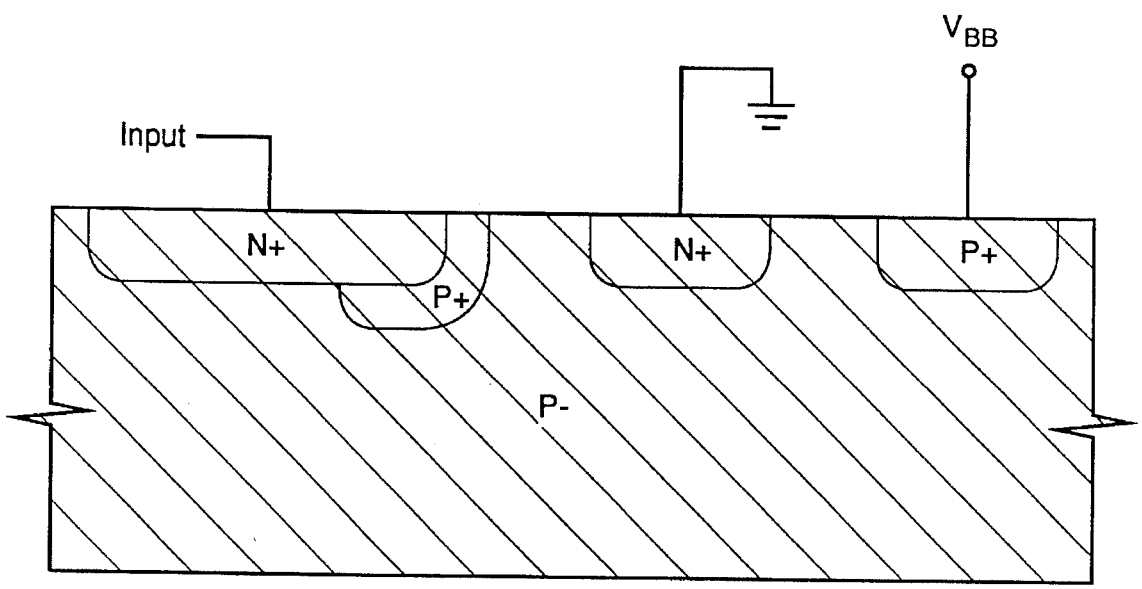
FIG. 4 shows a cross sectional view of a substrate, showing the structure of the circuit of FIG. 3.

FIGS. 3 and 4 show a similar approach for products using a non-grounded p type substrate. The mechanism for the improvement is the same where the breakdown voltage is selectively reduced locally at the input clamp devices. A bipolar diode 46 and a bipolar transistor 45 each have a locally reduced junction breakdown voltage, in a manner similar to diode 35 and transistor 35 of FIG. 1. This establishes a breakdown voltage beyond the normal range of operation of the internal circuitry 27, but below potentials which would be damaging to the internal circuitry 27.

In the configuration of FIGS. 3 and 4, the emitter of transistor 45 is connected to a ground potential, but the anode of the vertical diode 46 and the base of transistor 45 are connected to the substrate potential.

This enables positive surges in potential to discharge predominately through the NPN transistor 45 to ground, with the help of a locally reduced junction breakdown voltage.

Figure 5:
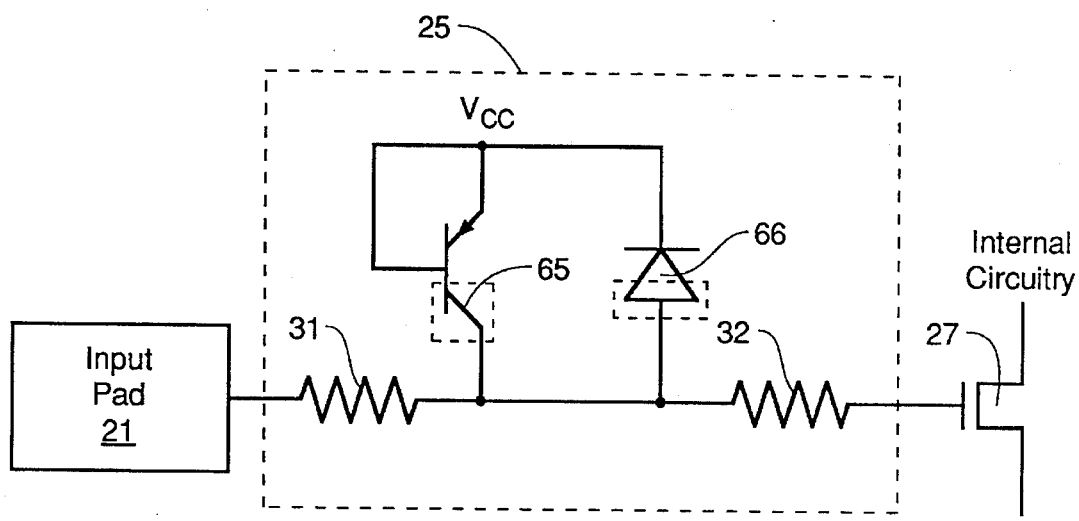
FIG. 5 shows a circuit configuration of an embodiment of the invention, utilizing an n type substrate, tied to supply.
Figure 6:
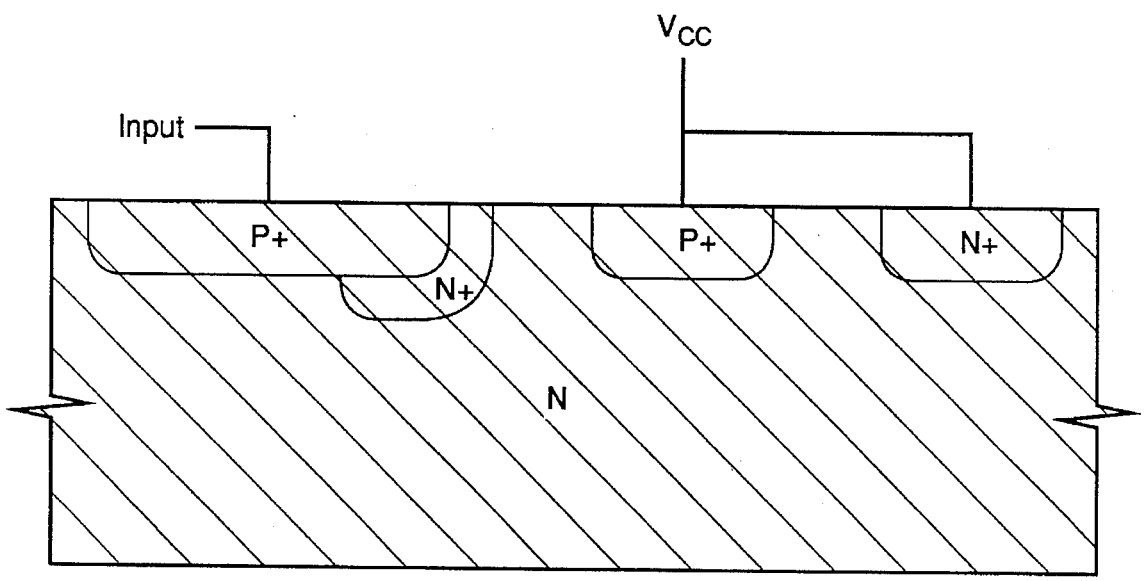
FIG. 6 shows a cross sectional view of a substrate, showing the structure of the circuit of FIG. 5.

Analogously, this approach may be used with n type substrates as shown in FIGS. 5 and 6. In this arrangement, we utilize a transistor 65 and diode 66 to clamp to $V_{CC}$ only. This provides solid ESD immunity and with relative simplicity of process and layout adjustments. FIG. 5 shows one version of the proposed approach applicable to products using an n type substrate connected to $V_{CC}$. Resistors 31, 32 have low values, preferably in the range of 0–500 ohms. Transistor 65 is a lateral PNP transistor, which along with diode 66, which is a vertical diode, provides the clamping function.

In order to improve the ESD immunity of the negative going ESD with respect to $V_{CC}$, the reverse bias breakdown of the transistor 65, configured as a collector/base diode, and the reverse bias breakdown of the diode 66 are reduced by means of n type species implantation (such as phosphorus or arsenic) into the p+/n junction region of the diode and/or the collector/base region of the transistor. The n type concentration of the collector base junction of transistor 65 is increased to the range of 1E16/cm$^3$ to 1E18/cm$^3$ to result in reverse bias breakdown voltages reduced to the 5–20 V range. Typically the n type implantation would be masked from all or most other devices on the IC to avoid unwanted parasitic capacitance on internal operating nodes. In many processes, including some advanced DRAM and SRAM process flows, this implant is already being used internally to provide for extra junction capacitance on selected nodes (such as storage bit nodes). The reduced reverse bias breakdown of the clamps provides for reduced voltage developed on internal nodes during an ESD event. It also reduces the heat generation by reducing the power generation during the ESD event by shunting the same amount of current through a smaller voltage drop.

Figure 7:
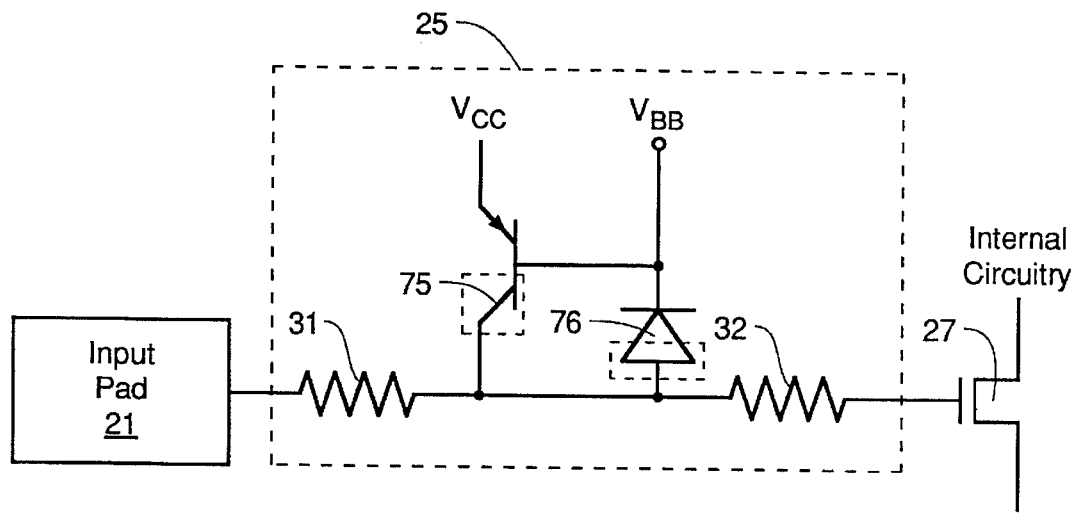
FIG. 7 shows a circuit configuration of an embodiment of the invention, utilizing an n type substrate, tied to a potential ($V_{BB}$) which is different from supply.
Figure 8:
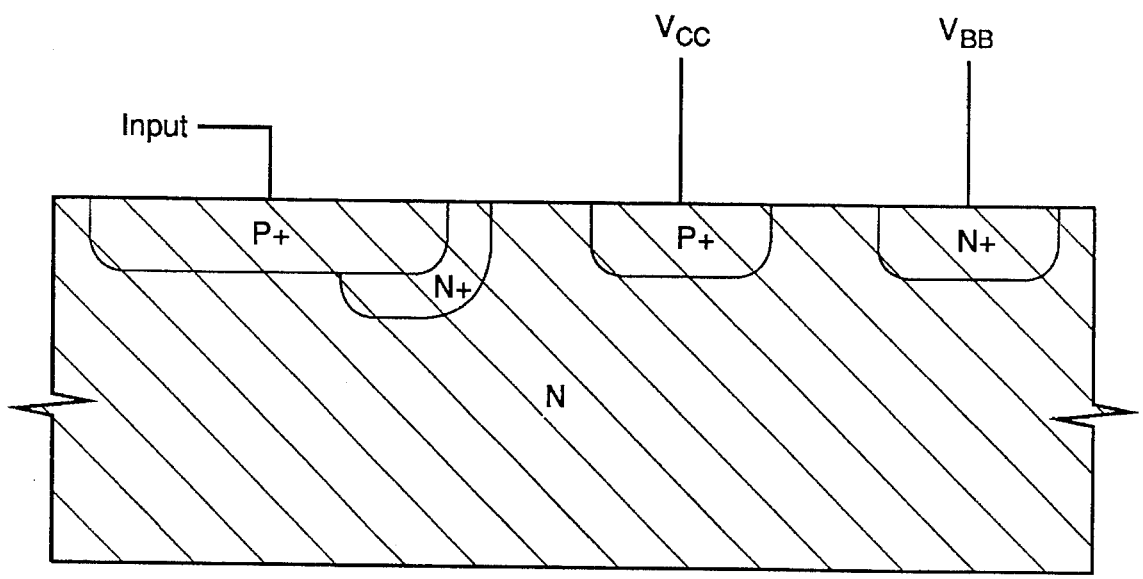
FIG. 8 shows a cross sectional view of a substrate, showing the structure of the circuit of FIG. 7.

FIGS. 7 and 8 show a similar approach for products using an n type substrate not connected to $V_{CC}$. The mechanism for the improvement is the same where the breakdown is selectively reduced locally at input clamp devices 75, 76. In this case, the diode 76 and the base of transistor 75 are connected to the substrate potential $V_{BB}$.

What has been described is a few specific embodiments of the invention. There are numerous other ways of implementing the invention. For example, various reference voltages can be connected to the base of the bipolar transistor. Accordingly, the invention should be considered as limited only by the appended claims.

We claim:

1. A semiconductor integrated circuit having internal circuitry, the integrated circuit further comprising:
   a) a bond pad connected to said internal circuitry
   b) a substrate of a first conductivity type;
   c) a first region of a second conductivity type within said substrate connected to said bond pad and to said internal circuitry via a conductor, said first region being sufficiently doped to form an ohmic contact with the conductor;
   d) a second region of the first conductivity type, of greater conductivity than said substrate, in a junction region of said substrate and said first region;
   e) a third region of the first conductivity type, of greater conductivity than said substrate, within said substrate, coupled to a substrate potential source;
   f) a fourth region of the second conductivity type within said substrate coupled to a reference potential node, wherein said first region forms a collector of a lateral bipolar transistor, a portion of said substrate between said first region and said fourth region forms a base of the transistor, said fourth region forms an emitter of the transistor, and said junction region is a collector/base junction of the lateral bipolar transistor; and
   the substrate is connected to a node other than the reference potential node.

2. A semiconductor structure for electrostatic discharge protection of an integrated circuit, comprising:
   a p-type substrate forming a base of a lateral NPN transistor;
   a first N+region within said substrate forming a collector of the NPN transistor and an ohmic contact region;
   a second N+region within said substrate forming an emitter of the NPN transistor;
   a p-type region within said substrate at a collector base N+/p– junction of the NPN transistor; and
   a second P+region withing said substrate, wherein said first N+region is coupled to an input of the integrated circuit, said second N+region is connected to a ground potential node, and said P+region is coupled to a reference potential node, wherein the reference potential node supplies a potential which is less than ground potential.

3. An integrated circuit having internal circuitry, the integrated circuit further comprising:
   a) an input node connected to the internal circuitry;
   b) a substrate of a first conductivity type;
   c) a first region of a second conductivity type within said substrate, said first region coupled to said input node and to the internal circuitry;
   d) a second region of the first conductivity type, of greater conductivity than said substrate, said second region in a junction region of said substrate and said first region;
   e) a third region of the first conductivity type, also of greater conductivity than said substrate, said third region within said substrate and coupled to a substrate potential source; and
   f) a fourth region of the second conductivity type and within said substrate, said fourth region coupled to a reference potential node which provides a potential other than the substrate potential, wherein said first region forms a collector of a lateral bipolar transistor, a portion of said substrate between said first region and said fourth region forms a base of the transistor, said fourth region forms an emitter of the transistor, and said junction region is a collector/base junction of the lateral bipolar transistor.

4. A semiconductor integrated circuit having internal circuitry, the integrated circuit further comprising:
   a) a bond pad connected to said internal circuitry
   b) a substrate of a first conductivity type;
   c) a first region of a second conductivity type within said substrate connected to said bond pad and to said internal circuitry via a conductor, said first region being sufficiently doped to form an ohmic contact with the conductor;
   d) a second region of the first conductivity type, of greater conductivity than said substrate, in a junction region of said substrate and said first region;
   e) a third region of the first conductivity type, of greater conductivity than said substrate, within said substrate, coupled to a substrate potential source; and
   f) a fourth region of the second conductivity type within said substrate coupled to a reference potential node, wherein said first region forms a collector of a lateral bipolar transistor, a portion of said substrate between said first region and said fourth region forms a base of the transistor, said fourth region forms an emitter of the transistor, and said junction region is a collector/base junction of the lateral bipolar transistor;

said second region is at a lateral and at a vertical junction region of said substrate and said first region whereby a vertical bipolar diode and a lateral bipolar transistor each have a reverse bias breakdown voltage dependent upon said second region.

5. An electrostatic discharge protection structure for an integrated circuit, comprising:
   a) a semiconductor substrate of a first conductivity type forming a base of a transistor and a first portion of a diode;
   b) a first region of a second conductivity type within said substrate, forming a lateral junction and a vertical junction with said substrate, coupled to an input of the integrated circuit, said first region forming a collector of the transistor and a second portion of the diode;

c) a second region of the second conductivity type within said substrate coupled to a reference potential node, forming an emitter of the transistor;

d) a third region of the first conductivity type, of greater conductivity than said substrate, located at the lateral junction and at the vertical junction.

6. An integrated circuit having internal circuitry, the integrated circuit further comprising:

a) an input node connected to the internal circuitry;

b) a substrate of a first conductivity type;

c) a first region of a second conductivity type within said substrate, said first region connected to said input node and to the internal circuitry;

d) a second region of the first conductivity type, of greater conductivity than said substrate, at a lateral and at a vertical junction region of said substrate and said first region;

e) a third region of the first conductivity type, of greater conductivity than said substrate, within said substrate, said third region coupled to a substrate potential source; and f) a fourth region of the second conductivity type within said substrate, said fourth region coupled to a reference potential node, wherein said first region forms a collector of a lateral bipolar transistor, a portion of said substrate between said first region and said fourth region forms a base of the transistor, said fourth region forms an emitter of the transistor, and said junction region is a collector/base junction of the lateral bipolar transistor.

7. A semiconductor integrated circuit having internal circuitry, the integrated circuit further comprising:

a) a bond pad connected to said internal circuitry b) a substrate of a first conductivity type;

c) a first region of a second conductivity type within said substrate connected to said bond pad and to said internal circuitry via a conductor, said first region being sufficiently doped to form an ohmic contact with the conductor;

d) a second region of the first conductivity type, of greater conductivity than said substrate, in a junction region of said substrate and said first region; and e) a third region of the first conductivity type, of greater conductivity than said substrate, within said substrate coupled to a substrate potential source; and f) a series resistor interposed between the bond pad and the internal circuitry, the series resistor comprises:

a) a first resistor connected in series between said first region and the bond pad; and b) a second resistor, having a resistance greater than said first resistor, connected in series between said first region and said internal circuitry.

8. A semiconductor integrated circuit having internal circuitry, the integrated circuit further comprising:

a) an input node connected to the internal circuitry;

b) a substrate region of a first conductivity type;

c) a first highly doped region of a second conductivity type adjacent said substrate region, coupled to said input node and to the internal circuitry;

d) a second region of the first conductivity type, of greater conductivity than said substrate, in a junction region of said substrate region and said first region; and e) a third highly doped region of the first conductivity type, adjacent said substrate region, coupled to a substrate potential source, wherein a current flows between said input node and the substrate potential source through said second region when a voltage across the junction region exceeds a first potential, and the current ceases to flow when the voltage across the junction falls below the first potential.

* * * * *

UNITED STATES PATENT AND TRADEMARK OFFICE
CERTIFICATE OF CORRECTION

PATENT NO. : 5,581,104
DATED : December 3, 1996
INVENTOR(S) : Tyler A. Lowrey et al.

It is certified that error appears in the above-identified patent and that said Letters Patent is hereby corrected as shown below:

At Column 8, line 8, after "within said substrate" please insert --,--.

At Column 4, line 35, please delete "diode 35" and insert --diode 36--.

In the ABSTRACT, line 4, after "use of a bipolar" please insert --transistor--.

In the ABSTRACT, line 5, please delete "biased" and insert --bias--.

In the ABSTRACT, line 10, please delete "transistor's" and insert --transistor--.

In the ABSTRACT, line 13, please delete "Cmos" and insert --CMOS--.

Signed and Sealed this

Seventh Day of October, 1997

Attest:

BRUCE LEHMAN

*Attesting Officer*       *Commissioner of Patents and Trademarks*